United States Patent
Stone

(10) Patent No.: US 9,640,676 B2
(45) Date of Patent: May 2, 2017

(54) METHODS AND STRUCTURES FOR IMPROVING THE STRUCTURAL INTEGRITY OF SOLAR CELLS

(71) Applicant: SunPower Corporation, San Jose, CA (US)

(72) Inventor: Charles Norman Stone, Cedar Park, TX (US)

(73) Assignee: SunPower Corporation, San Jose, CA (US)

( * ) Notice: Subject to any disclaimer, the term of this patent is extended or adjusted under 35 U.S.C. 154(b) by 591 days.

(21) Appl. No.: 13/905,504

(22) Filed: May 30, 2013

(65) Prior Publication Data
US 2014/0000695 A1    Jan. 2, 2014

Related U.S. Application Data

(60) Provisional application No. 61/849,818, filed on Jun. 29, 2012, provisional application No. 61/803,041, filed on Mar. 18, 2013.

(51) Int. Cl.
*H01L 31/0224* (2006.01)
*H01L 31/18* (2006.01)
(Continued)

(52) U.S. Cl.
CPC .... *H01L 31/022433* (2013.01); *H01L 31/048* (2013.01); *H01L 31/0682* (2013.01);
(Continued)

(58) Field of Classification Search
None
See application file for complete search history.

(56) References Cited

U.S. PATENT DOCUMENTS 4,592,925 A    6/1986  Du Pont et al.
5,688,841 A   11/1997  Parish
(Continued)

FOREIGN PATENT DOCUMENTS

CN    101490168        7/2009
CN    101490851 A      7/2009
(Continued)

OTHER PUBLICATIONS

Minoru Iwata, et al. "Properties of Newly Developed Thermoplastic Polyimide and its Durablity under Proton, Electron, and UV Irradiations", Sep. 15-18, 2009, 11th International Symposium on Materials in a Space Environment, [obtained from PCT/2013/048282, Nov. 20, 2013, International Search Report].

(Continued)

*Primary Examiner* — Jennifer Michener
*Assistant Examiner* — Christopher Danicic
(74) *Attorney, Agent, or Firm* — Okamoto & Benedicto LLP

(57) ABSTRACT

A method for manufacturing solar cells is disclosed. The method includes forming an insulating material in a printable suspension along the at least one side edge of a solar cell, the insulating material in a printable suspension further adapted to form a protective film which reduces cracking near at least one side edge of the solar cell and improve structural integrity against mechanical stress. The protective film has an elastic modulus of at least 3 GPa, an elongation break point of at least 13 percent and a glass transition temperature of at least 250 degrees Celsius which provides additional structural support along the side edges, increasing the overall structural integrity, providing electrical insulation along the edges and improve the flexure strength of the solar cell.

20 Claims, 12 Drawing Sheets

(51) Int. Cl.
    *H01L 31/048*    (2014.01)
    *H01L 31/068*    (2012.01)
    *H01L 31/0747*   (2012.01)

(52) U.S. Cl.
    CPC .......... *H01L 31/0747* (2013.01); *H01L 31/18* (2013.01); *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 7,335,835 B2 | 2/2008 | Kukulka et al. | |
| 2003/0047752 A1* | 3/2003 | Campbell | H01L 31/107 257/186 |
| 2007/0257198 A1* | 11/2007 | Ogawa | G01T 1/2002 250/370.11 |
| 2008/0017243 A1* | 1/2008 | De Ceuster | H01L 31/022425 136/255 |
| 2008/0202584 A1* | 8/2008 | Basol | H01L 31/03928 136/262 |
| 2008/0245406 A1* | 10/2008 | Yamazaki | H01L 31/068 136/252 |
| 2011/0036400 A1 | 2/2011 | Murphy et al. | |
| 2011/0053312 A1 | 3/2011 | Teppe et al. | |
| 2011/0120531 A1* | 5/2011 | Nese | H01L 31/1804 136/251 |
| 2011/0272016 A1 | 11/2011 | De Ceuster et al. | |
| 2012/0052622 A1* | 3/2012 | Takahama | H01L 31/022441 438/96 |
| 2012/0103408 A1 | 5/2012 | Moslehi et al. | |
| 2012/0322199 A1* | 12/2012 | Graff | H01L 31/0682 438/97 |

FOREIGN PATENT DOCUMENTS

| | | |
|---|---|---|
| EP | 2 482 334 | 1/2012 |
| WO | 2008/013604 | 1/2008 |

OTHER PUBLICATIONS

PCT International Search Report and Written Opinion of the International Searching Authority for Application No. PCT/US2013/048282, Nov. 20, 2013, 9 sheets.

Search Report for China Application No. 2013800301835 dated, Jan. 14, 2016 [Jan. 14, 2016], 2 sheets.

* cited by examiner

METHODS AND STRUCTURES FOR IMPROVING THE STRUCTURAL INTEGRITY OF SOLAR CELLS

CROSS-REFERENCE TO RELATED APPLICATIONS

This application claims the benefit of U.S. Provisional Application No. 61/849,818, having a filing date of Jun. 29, 2012 and U.S. Provisional Application No. 61/803,041, having a filing date of Mar. 18, 2013, both of which are incorporated herein by reference in their entirety.

TECHNICAL FIELD

Embodiments of the subject matter described herein relate generally to solar cells. More particularly, embodiments of the subject matter relate to solar cells structures and fabrication processes.

BACKGROUND

Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell. The robustness and structural integrity of a solar cell to withstand varying physical forces is an important characteristic of a solar cell as it is directly related to the solar cell's capability to withstand induced stress due to shipping, handling and the environment.

These or other similar embodiments form the background.

BRIEF DESCRIPTION OF THE DRAWINGS

A more complete understanding of the subject matter can be derived by referring to the detailed description and claims when considered in conjunction with the following figures, wherein like reference numbers refer to similar elements throughout the figures.

DETAILED DESCRIPTION

Figure 1:
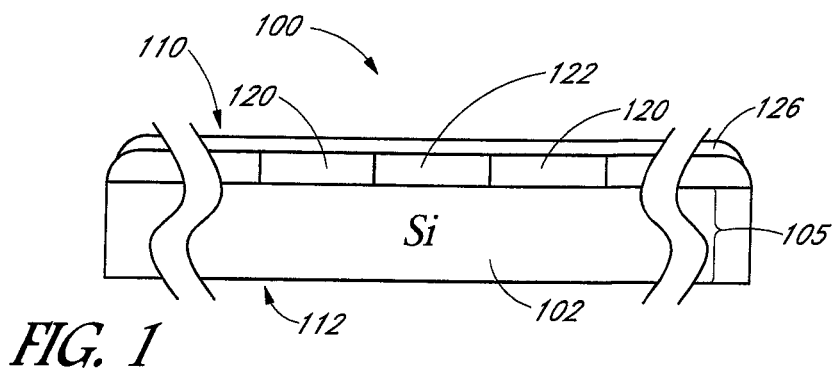
FIGS. 1-8 are cross-sectional representations of a solar cell being fabricated in accordance with an embodiment of a method for manufacturing a solar cell.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background or the following detailed description.

Additionally, numerous specific details are set forth, such as specific process flow operations, in order to provide a thorough understanding of the method and its embodiments. It will be apparent to one skilled in the art that the method and its embodiments may be practiced without these specific details. In other instances, well-known fabrication techniques, such as lithographic and etch techniques, are not described in detail in order to not unnecessarily obscure the method and its embodiments. Furthermore, it is to be understood that the various embodiments shown in the figures are illustrative representations and are not necessarily drawn to scale.

A method for manufacturing a solar cell is disclosed. The method includes providing a solar cell having a front side which faces the sun during normal operation, a back side opposite the front side, and four side edges. The method includes forming first and second doped regions on the back side of the solar cell. The method includes forming a first insulating material in a printable suspension along at least one side edge of the solar cell, where the first insulating material forms a protective film with an elastic modulus of at least 3 gigapascals (GPa). The method also includes forming a first plurality of interdigitated metal contact fingers electrically coupled to the first doped region. The method also includes forming a second plurality of interdigitated metal contact fingers electrically coupled to the second doped region.

Another method for manufacturing a solar cell is disclosed. The method includes providing a solar cell having a front side which faces the sun during normal operation, a back side opposite the front side, and four side edges. The method includes forming a first doped region on the back side of the solar cell including a continuous diffusion region. The method includes forming a second doped region including a dotted diffusion region, where the first doped region surrounds each of the dotted diffusion regions. The method includes forming a first and second insulating material in a printable suspension, where both the first and second insulating material form a first and second protective film with an elastic modulus of at least 3 gigapascals (GPa). The method includes forming a first plurality of interdigitated metal contact fingers electrically coupled to the first doped region. The method includes forming a second plurality of interdigitated metal contact fingers electrically coupled to the second doped region, where the first protective film is formed along at least one side edge of the solar cell. In an embodiment, the first protective film is further adapted to reduce cracking near at least one side edge of the solar cell. In another embodiment, the second protective film is located in between the first doped region and the second plurality of interdigitated metal contact fingers. In still another embodiment, both the first and second protective films improve solar cell structural integrity against mechanical stress.

Still another method for manufacturing a solar cell is disclosed. The method includes providing a solar cell having a front side which faces the sun during normal operation, a back side opposite the front side, and four side edges. The method includes forming first and second doped regions in an interdigitated pattern on to a silicon substrate. The method includes ablating a first and second plurality of contact holes. The method includes forming a first insulating material in a printable suspension along at least one side edge of the solar cell, where the first insulating material forms a first protective film with an elastic modulus of at least 3 gigapascals (GPa). In an embodiment, the first protective film is adapted to reduce cracking near at least one side edge of the solar cell and improve structural integrity against mechanical stress. The method includes forming a first plurality of interdigitated metal contact fingers electrically coupled to the first doped region. The method includes forming a second plurality of interdigitated metal contact fingers electrically coupled to the second doped region, where the first and second plurality of contact holes allow the first and second doped regions to be electrically coupled to the first and second plurality of interdigitated metal contact fingers respectively.

Yet another method for manufacturing a solar cell is disclosed. The method includes providing a solar cell having a front side which faces the sun during normal operation, a back side opposite the front side, and four side edges. The method includes forming first and second doped regions in an interdigitated pattern on the back side of the solar cell. The method includes forming a first dielectric layer between the silicon substrate and the first and second doped region. The method includes forming a trench region between the first and second doped region. In an embodiment, the method includes forming a second dielectric layer within the trench region. The method includes forming a first insulating material in a printable suspension along at least one side edge of the solar cell, where the first insulating material forms a first protective film with an elastic modulus of at least 3 gigapascals (GPa). In an embodiment, the first protective film is further adapted to reduce cracking near at least one side edge of the solar cell and improve structural integrity against mechanical stress. The method includes forming a first plurality of interdigitated metal contact fingers electrically coupled to the first doped region and forming a second plurality of interdigitated metal contact fingers electrically coupled to the second doped region.

Another method for manufacturing a solar cell is disclosed. The method includes providing a solar cell having a front side which faces the sun during normal operation, a back side opposite the front side, and four side edges. The method includes forming first and second doped regions on the back side of a solar cell, where the first and second doped regions are on a thin silicon substrate with a thickness in a range of 50-140 microns. The method includes depositing a first insulating material in a printable suspension along at least one side edge of the solar cell, where the first insulating material forms a first protective film with an elastic modulus of at least 3 gigapascals (GPa) and a glass transition temperature of at least 250 degrees Celsius. In an embodiment, the first protective film is further adapted to reduce cracking near at least one side edge of the solar cell and improve structural integrity against mechanical stress. The method includes forming a first and second plurality of interdigitated metal contact fingers through an electroplating process, where the first and second plurality of interdigitated metal contact fingers electrically coupled to the first and second doped regions. In an embodiment, the first and second plurality of interdigitated metal contact fingers are coupled to the first and second doped regions through a plurality of contact holes.

Still another method of manufacturing a solar cell is disclosed. The method includes providing a solar cell having a front side which faces the sun during normal operation, a back side opposite the front side, and four side edges. The method includes forming P-type and N-type doped regions on the back side of the solar cell on a thin silicon substrate. The method includes forming polyimide or a polyimide paste, along at least one side edge of the solar cell, where the polyimide paste forms a polyimide film with an elastic modulus of at least 3 gigapascals (GPa). In an embodiment, the polyimide film is further adapted to reduce cracking near at least one side edge of the solar cell and improve structural integrity against mechanical stress. The method also includes forming a first plurality of interdigitated metal contact fingers electrically coupled to the P-type doped region and forming a second plurality of interdigitated metal contact fingers electrically coupled to the N-type doped region.

The various tasks performed in connection with manufacturing processes are shown in FIGS. 1-20. Also, several of the various tasks need not be performed in the illustrated order, and it can be incorporated into a more comprehensive procedure, process or fabrication having additional functionality not described in detail herein.

FIG. 1 illustrates a solar cell used in conjunction with an embodiment of the present inventions. The method includes providing a solar cell 100 having a front side 112 which faces the sun during normal operation, a back side 110 opposite the front side 112, and four side edges. The solar cell also includes a silicon substrate 102 and first and second doped regions 120, 122. In some embodiments, the silicon substrate 102 is cleaned, polished, planarized, and/or thinned or otherwise processed prior to the formation of the first and second doped regions 120, 122. In still another embodiment, the silicon substrate thickness 105 is thick or having a thickness of greater than 140 microns. In yet another embodiment the silicon substrate 102 is polysilicon or multi-crystalline. In another embodiment, first and second doped regions 120, 122 are formed through a thermal process. In still another embodiment, an oxide layer is deposited over the first and second doped regions 120, 122, serving as a protective barrier for both regions. The first and second doped regions 120, 122 each includes a doping material but are not limited to a positive-type dopant such as boron or a negative-type dopant such as phosphorous. Although both the first and second doped regions 120, 122 are described as being grown by a thermal process or formed in conjunction with a conventional doping process, respectively, as with any other formation, deposition, or growth process step described or recited here, each layer or substance is formed using any appropriate process. For example, a chemical vapor deposition (CVD) process, low-pressure CVD (LPCVD), atmospheric pressure CVD (AP-CVD), plasma-enhanced CVD (PECVD), thermal growth, sputtering, as well as any other desired technique is used where formation is described. Thus, and similarly, the first and second doped regions 120, 122 are formed on the silicon substrate 102 by a deposition technique, sputter, or print process, such as screen printing. The method also includes forming a first dielectric layer 126 over the first and second doped regions 120, 122. In an embodiment, the first dielectric layer is silicon nitride (SiN). In another embodiment, a texturized region can be formed on the front side 112 of the solar cell 100 for increased solar radiation collection. A texturized region is one which has a regular or an irregular shaped surface for scattering incoming light, decreasing the amount of light reflected back of the surface of the solar cell 100. In still another embodiment, a second dielectric layer can be formed on the texturized region on the front side 112 of the solar cell 100. In still another embodiment, the second dielectric layer is silicon nitride (SiN). In yet another embodiment, the first and second dielectric layers are anti-reflective layers.

Figure 2:
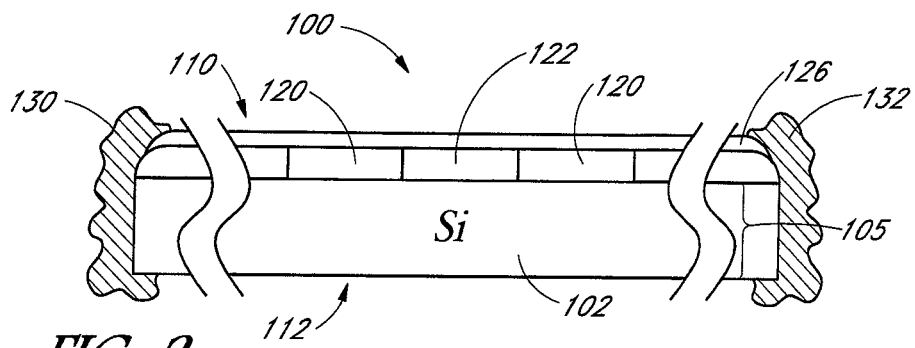
Figure 3:
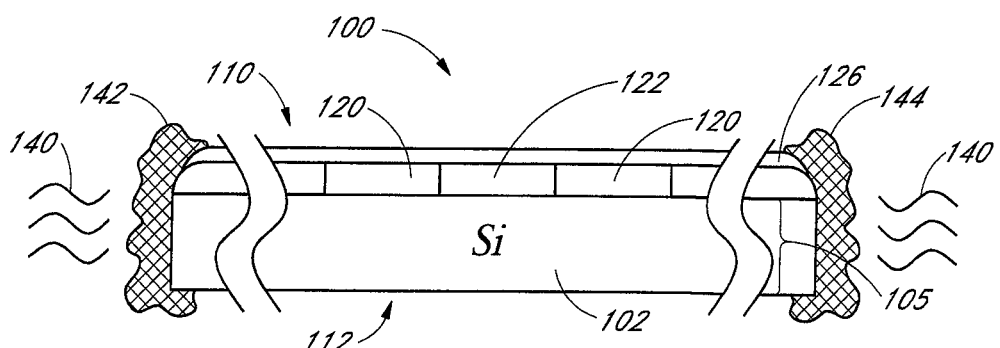

With reference to FIGS. 2 and 3, there is shown a method of forming an insulating material on at least one side edge of the solar cell of FIG. 1. The method further includes forming an insulating material 130, 132 along the side edges of the solar cell 100. In an embodiment, the insulating material 130, 132 is in the form of a printable suspension allowing it to be applied in any one of the following means: screen printing or using an edge coat ink application tool, where the edge coat ink application tool uses a contactless mechanism to apply the insulating material 130, 132. In an embodiment, the insulating material is cured 140 to form an intermediate state 142, 144 as seen in FIG. 3. The curing process 140 is also be performed by, for example, thermal curing, photo-curing, or chemical curing, without limitation. In an embodiment, depositing the insulating material 130, 132 includes depositing a polymer material. In another embodiment depositing the insulating material includes depositing a polyvinyl chloride (PVC).

Figure 4:
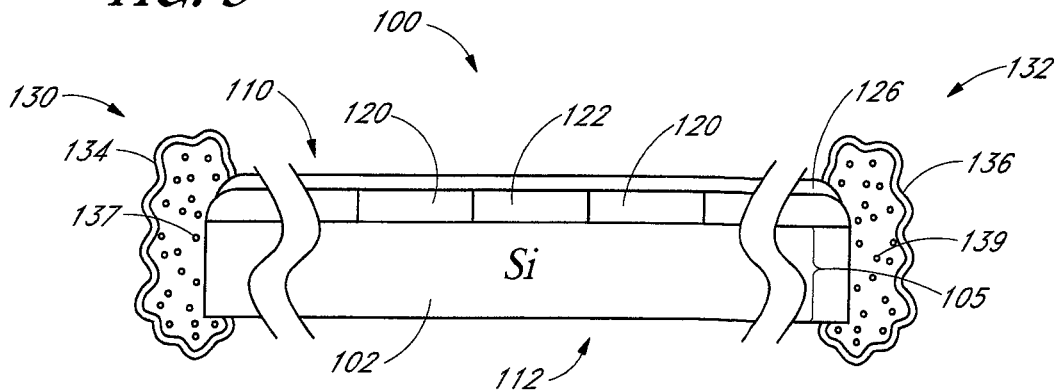
Figure 5:
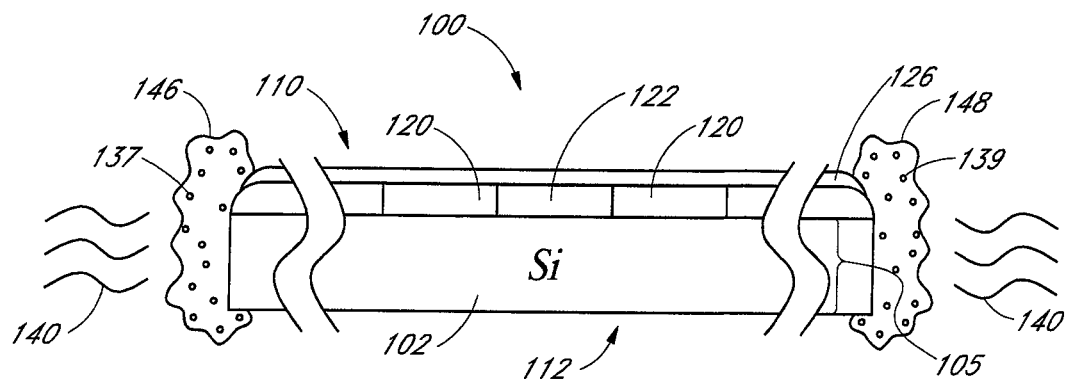

FIGS. 4 and 5 illustrate another method of forming an insulating material on at least one side edge of the solar cell of FIG. 1. The method includes forming a first insulating material 130, 132 having varnish 134, 136 and a filler material 137, 139. Subsequently, the first insulating material 130, 132 is applied by the same means specified above. As shown in FIG. 5, the first insulating material 130, 132 is cured 140 by standard curing processes such as a thermal curing or photo-curing similar to the above. During the curing process 140, the filler dissolves into the varnish at an intermediate state 146, 148, where further curing forms the protective film 150, 152 seen in FIG. 6. The curing process 140 includes ramping up the temperature from a first curing temperature to a second curing temperature over a first curing duration. The temperature is maintained at a second curing temperature to allow the filler to dissolve into the varnish as described above. The temperature is decreased to the first curing temperature over a third curing duration. In an embodiment, the curing process includes an extended curing process which is executed in a horizontal type thermal oven to maximize thermal exposure and manufacturing output efficiency. In an embodiment, the first insulating material 130, 132 is polyimide.

Figure 6:
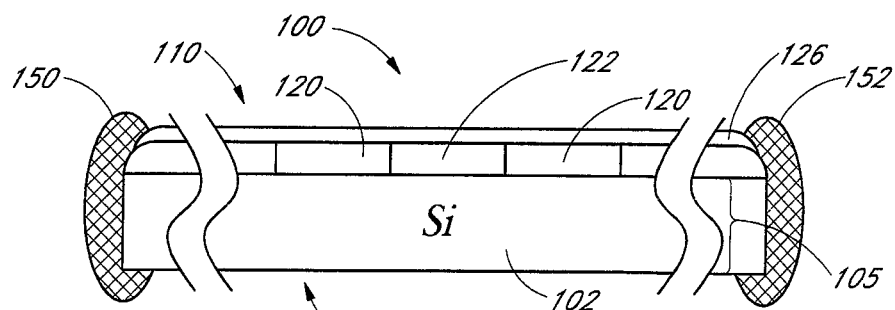

With reference to FIG. 6, there is shown a continuation of the method of manufacturing the solar cell of FIG. 1. The method further includes forming the protective film 150, 152 after curing 140 the insulating material 130, 132 as shown in the embodiments of FIGS. 3 and 5. The method includes positioning the protective film 150, 152 along the side edge of the solar cell 100 to improve structural integrity by protecting the side edges against mechanical stress which can cause micro-cracks, especially for decreasing silicon substrate thickness 105. In an embodiment, the protective film 150, 152 has an elastic modulus of at least 3 GPa. The glass transition temperature of the protective film 150, 152 can have a major impact as the protective film 150, 152 needs to withstand heat exposure during manufacturing and from the environment. In an embodiment, the protective film 150, 152 has a glass transition temperature of at least 250 degrees Celsius to enable it to reliably withstand the heat from the environment and manufacturing processes. In another embodiment, the protective film 150, 152 includes a uniform dissolution of the filler, providing structural support along the side edges of the solar cell 100. In still another embodiment, the protective film 150, 152 is a good insulator, protecting against any electrical damage, such as in case at least two solar cells contact at the edges when placed within a solar module. In yet another embodiment, the protective film 150, 152 protects against mechanical stress or cracking, where the protective film has an elongation break point of at least 13 percent. In another embodiment, the protective film 150, 152 provides additional structural support along the side edges, increasing the overall flexure strength of the solar cell 100. In still another embodiment, the protective film 150, 152 acts as a protective layer along the side edges during an electroplating process, where the protective film 150, 152 prevents metal from plating along the solar cell edges.

Figure 7:
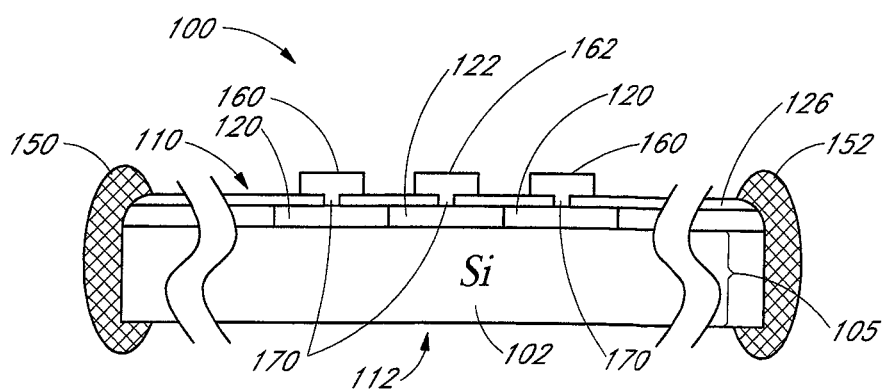

FIG. 7 illustrates the continuation of the method of manufacturing the solar cell of FIG. 1. The method further includes forming contact holes 170 through the first dielectric layer 126 to expose first and second doped regions 120, 122. In an embodiment, the contact holes 170 are formed using a chemical etch, ablation or any industry standard lithography process. The method includes performing an electroplating process to form a first and second plurality of interdigitated metal contact fingers 160, 162 above the first and second doped regions 120, 122. In an embodiment, the first and second interdigitated contact fingers 160, 162 are coupled to the first and second doped regions 120, 122 through the contact holes 170. In another embodiment, the first and second interdigitated contact fingers are composed of metals such as copper, tin, aluminum, silver, gold, chromium, iron, nickel, zinc, ruthenium, palladium, and platinum. Other metals can be used, if desired for the embodiment, as well. FIGS. 1-7 show a cross-sectional view of the solar cell 100 with a thickness 105 greater than 140 microns. In contrast to the above FIG. 8 below illustrates a solar cell 100 with a thinner thickness below 140 microns.

Figure 8:
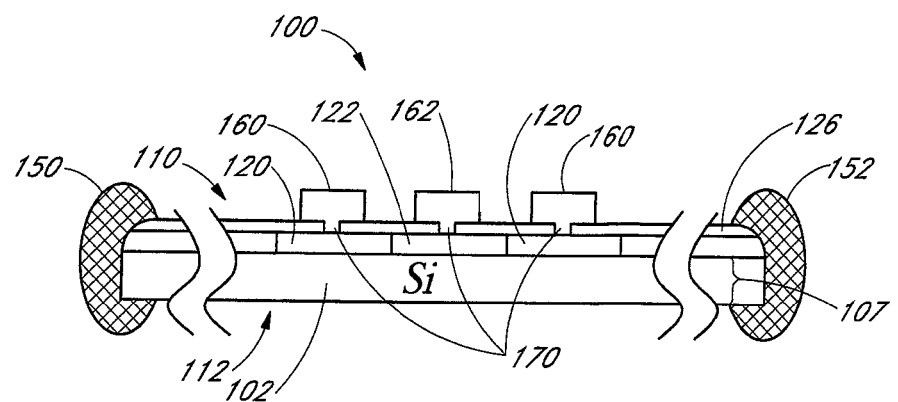

With reference to FIG. 8, there is shown the continued method of manufacturing a solar cell. The method further includes providing a "thin" solar cell 100 with a thickness 107 in the range of 50-140 microns. As discussed above, forming a protective film 150, 152 along the side edges improves structural integrity by protecting the solar cell 100 against mechanical stress. This is especially true for the thin solar cells 100 of FIG. 8 because solar cells with decreasing silicon substrate thickness 107 are more prone to cracks or even micro-cracks at the edges.

Figure 9:
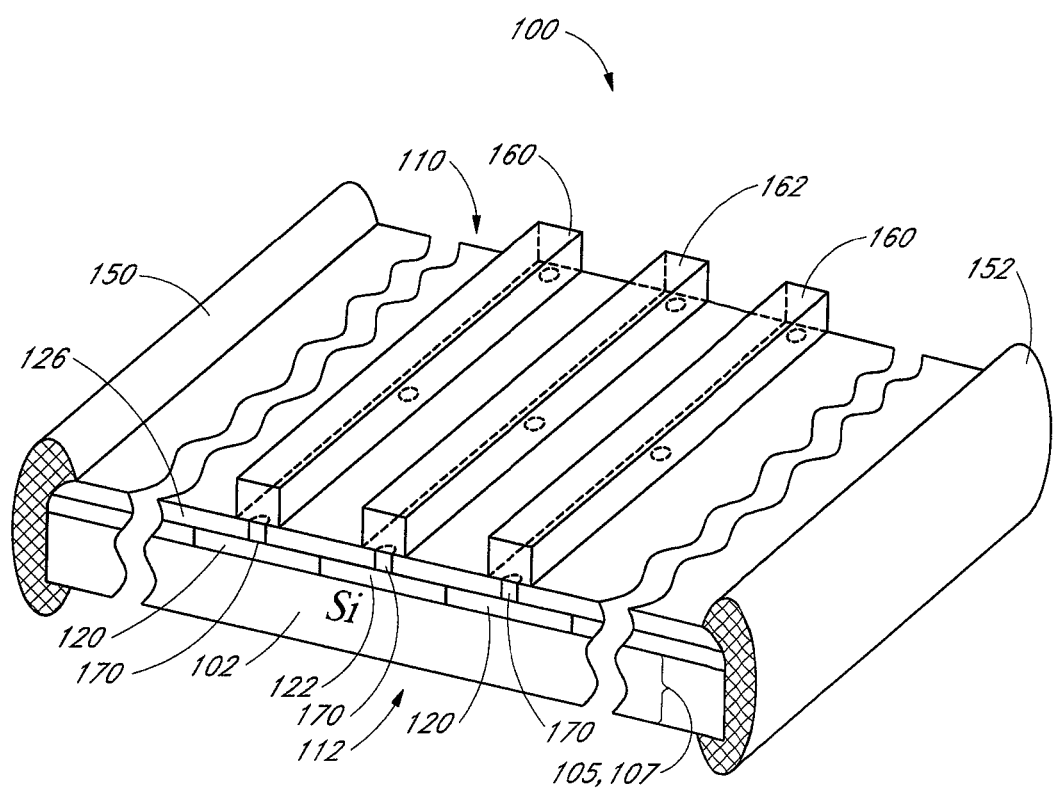
FIG. 9 is a perspective view of the solar of FIG. 1-8 in accordance with an embodiment of a method for manufacturing a solar cell.

FIG. 9 illustrates a perspective view of the solar cell of FIGS. 1-8. As discussed above, the solar cell includes a silicon substrate 102. In an embodiment, the silicon substrate 102 has a thickness 105 which is thick or greater than 140 microns. In another embodiment, the silicon substrate 102 has a thickness 107 which is thin or in the range of 50-140 microns. The silicon substrate 102 includes first and second doped regions 120, 122. A first dielectric layer 126 is formed over the first and second doped regions 120, 122. In an embodiment, the first and second interdigitated contact fingers 160, 162 are coupled to the first and second doped regions 120, 122 through the contact holes 170. FIG. 9 shows the protective film 150, 152 formed along the side edges of the solar cell 100.

Figure 10:
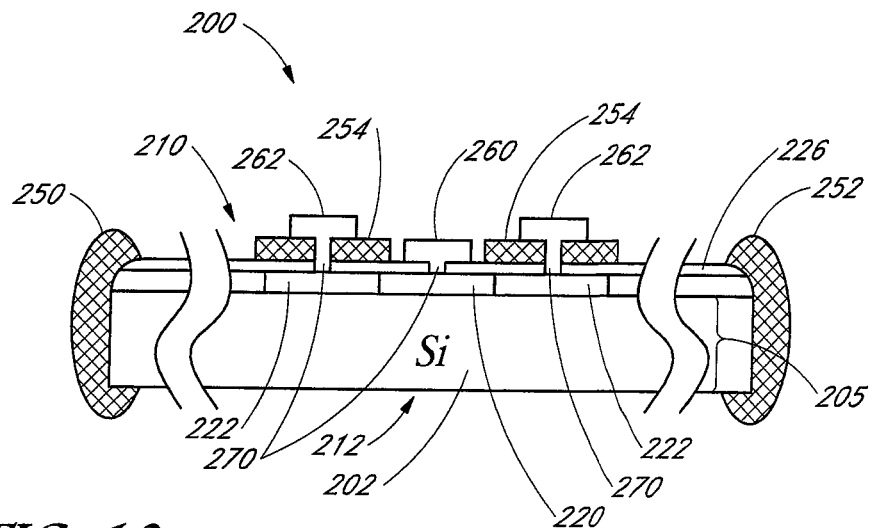
FIG. 10 is another cross-sectional representation of a solar cell being fabricated in accordance with an embodiment of a method for manufacturing a solar cell.

With reference to FIG. 10, there is shown another embodiment of the method for fabricating a solar cell. The method includes providing a solar cell 200 having a front side 212 which faces the sun during normal operation, a back side 210 opposite the front side 212, and four side edges. The method includes forming first and second doped regions 220, 222 on the back side 210 of the solar cell 200, where the solar cell 200 includes a silicon substrate 202. In an embodiment the silicon substrate 202 is polysilicon or multi-crystalline. In another embodiment, the silicon substrate 202 has thickness 205 in the range of 50-140 microns. In another embodiment, the silicon substrate 202 has a thickness 205 greater than 140 microns. In still another embodiment, the first doped region 220 includes a continuous diffusion region and the second doped region 222 includes a dotted diffusion region, where the continuous diffusion region 220 surrounds each of the dotted diffusion regions 222. In yet another embodiment, first and second doped regions 220, 222 are formed through a thermal process. In an embodiment, an oxide layer is deposited over the first and second doped regions 220, 222, serving as a protective barrier for both regions. In another embodiment, the first and second doped regions 220, 222 each includes a doping material but is not limited to a positive-type dopant such as boron or a negative-type dopant such as phosphorous. Subsequent to forming first and second doped regions 220, 222, a first protective film 250, 252 is formed along the edges of the solar cell. The method includes forming a first dielectric layer 226 over the first and second doped regions 220, 222 prior to forming the first dielectric layer 226. In an embodiment, the first dielectric layer 226 is composed of silicon nitride (SiN). The method includes forming a second protective film 254 over first and second doped region 220, 222 and the first dielectric layer 226. In another embodiment, the first protective film 250, 252 and second protective film 254 both have an elastic modulus of at least 3 GPa as discussed above. The method further includes forming contact holes 270 that expose the first and second doped regions 220, 222 and through the first dielectric layer 226 and second protective film 254. In still another embodiment, an electroplating process is used to form a first and second plurality of interdigitated metal contact fingers 260, 262. In yet another embodiment, the first and second plurality of interdigitated metal contact fingers 260, 262 are electrically coupled through contact holes 270 to the first and second doped regions 220, 222 respectively. In yet another embodiment, the first protective film 250, 252 is applied in a first printing process separate from the application of the second protective film 254. In an embodiment, the first printing process of the first protective film 250, 252 is performed before the application of the second protective film 254. In another embodiment, the second protective film 254 is applied prior to an electroplating process. In still another embodiment, both the first and second film 250, 252, 254 are adapted to reduce cracking throughout the entirety of the solar cell 200, where both protective films 250, 252, 254 improve structural integrity against mechanical stress. In another embodiment, a texturized region can be formed on the front side 212 of the solar cell 200 for increased solar radiation collection. A texturized region 220 is one which has a regular or an irregular shaped surface for scattering incoming light, decreasing the amount of light reflected back of the surface of the solar cell 200. In still another embodiment, a second dielectric layer can be formed on the texturized region on the front side 212 of the solar cell 200. In still another embodiment, the second dielectric layer is composed of silicon nitride (SiN). In yet another embodiment, the first and second dielectric layers are anti-reflective layers.

Figure 11:
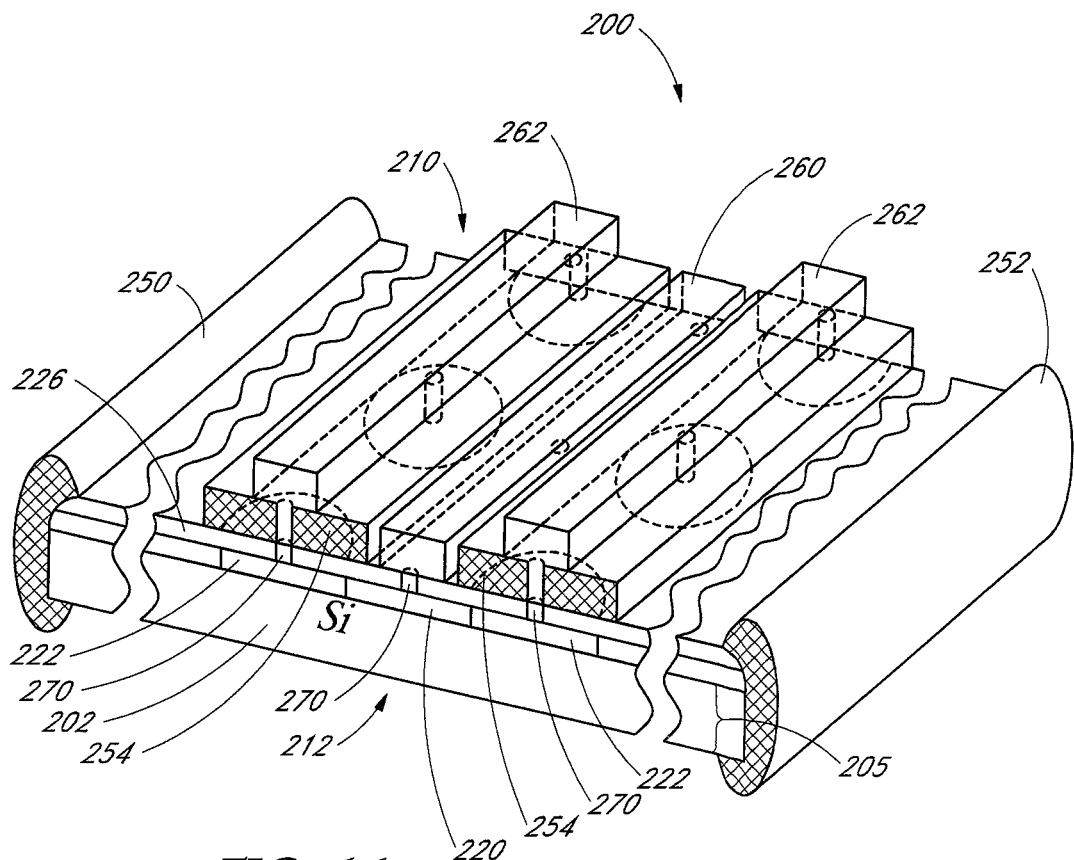
FIG. 11 is a perspective view of the solar cell of FIG. 10 in accordance with an embodiment of a method for manufacturing a solar cell.

FIG. 11 illustrates a perspective view of the solar cell of FIG. 10. As discussed above, the solar cell 200 includes a silicon substrate 202. In an embodiment, the silicon substrate 202 has a thickness 205 which is thick or greater than 140 microns. In another embodiment, the silicon substrate 202 has a thickness 205 which is thin or in the range of 50-140 microns. The silicon substrate 202 includes first and second doped regions 220, 222. A first dielectric layer 226 is formed over the first and second doped regions 220, 222. In an embodiment, the first and second interdigitated contact fingers 260, 262 are coupled to the first and second doped regions 220, 222 through the contact holes 270. FIG. 11 shows the first protective film 250, 252 formed along the side edges of the solar cell 200. FIG. 11 also shows the second protective film 254 above the first and second doped regions 220, 222 and the first dielectric layer 226 separating the second interdigitated contact fingers 262 from contacting the first doped region 220.

Figure 12:
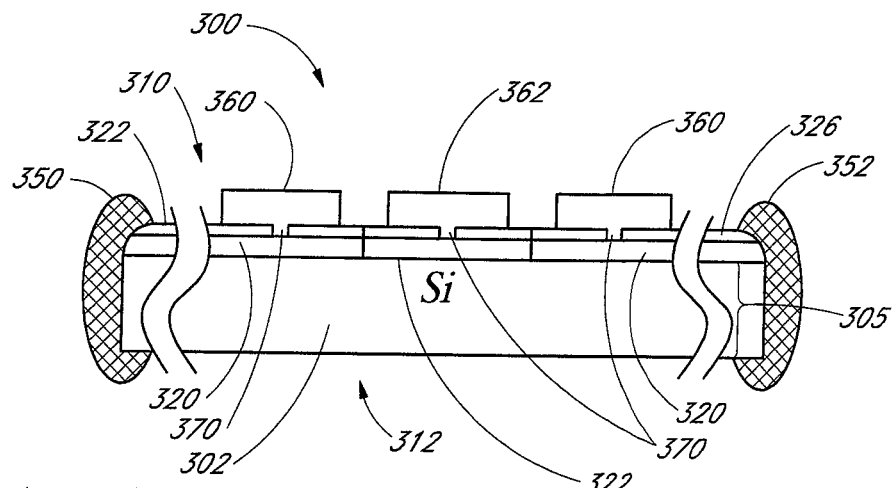
FIG. 12 is another cross-sectional representation of a solar cell being fabricated in accordance with an embodiment of a method for manufacturing a solar cell.

FIG. 12 illustrates still another method for fabricating a solar cell. The method includes providing a solar cell 300 having a front side 312 which faces the sun during normal operation, a back side 310 opposite the front side 312, and four side edges. The method includes forming a first and second doped regions 320, 322 on the back side of the solar cell 300, where the solar cell 300 includes a silicon substrate 302. In an embodiment the silicon substrate 302 is polysilicon or multi-crystalline. In an embodiment, the silicon substrate 302 has thickness 305 in the range of 50-140 microns. In another embodiment, the silicon substrate 302 has a thickness 305 greater than 140 microns. Both the first and second doped regions 320, 322 include diffusion regions in an interdigitated pattern. In an embodiment, the first and second doped regions 320, 322 are formed through a thermal process. In another embodiment, an oxide layer is deposited over the first and second doped regions 320, 322, serving as a protective barrier for both regions. In still another embodiment, the first and second doped regions 320, 322 each includes a doping material but is not limited to a positive-type dopant such as boron or a negative-type dopant such as phosphorous. As mentioned earlier, an embodiment of the present inventions includes both the first and second doped regions 320, 322 being formed using any appropriate process. The method further includes forming a first dielectric layer 326 over the first and second doped regions 320, 322. In an embodiment, the first dielectric layer 326 is composed of silicon nitride (SiN). The method includes forming a first and second plurality of contact holes 370 through the first dielectric layer 326 to expose the first and second doped regions 320, 322. In an embodiment, the first protective film 350, 352 has an elastic modulus of at least 3 GPa. In another embodiment, the application of the first protective film 350, 352 along the side edges of the solar cell 300 prevents cracking and improves structural integrity against mechanical stress. In still another embodiment, the contact holes 370 are formed through an ablation process including, but not limited to, laser ablation. The method includes performing an electroplating process to form a first and second plurality of interdigitated metal contact fingers 360, 362, where the first and second plurality of interdigitated metal contact fingers 360, 362 are electrically coupled through the contact holes 370 to the first and second doped regions 320, 322 respectively. In an embodiment, a texturized region can be formed on the front side 312 of the solar cell 300 for increased solar radiation collection. A texturized region 320 is one which has a regular or an irregular shaped surface for scattering incoming light, decreasing the amount of light reflected back of the surface of the solar cell 300. In still another embodiment, a second dielectric layer can be formed on the texturized region on the front side 312 of the solar cell 300. In still another embodiment, the second dielectric layer is composed of silicon nitride (SiN). In yet another embodiment, the first and second dielectric layers are anti-reflective layers.

Figure 13:
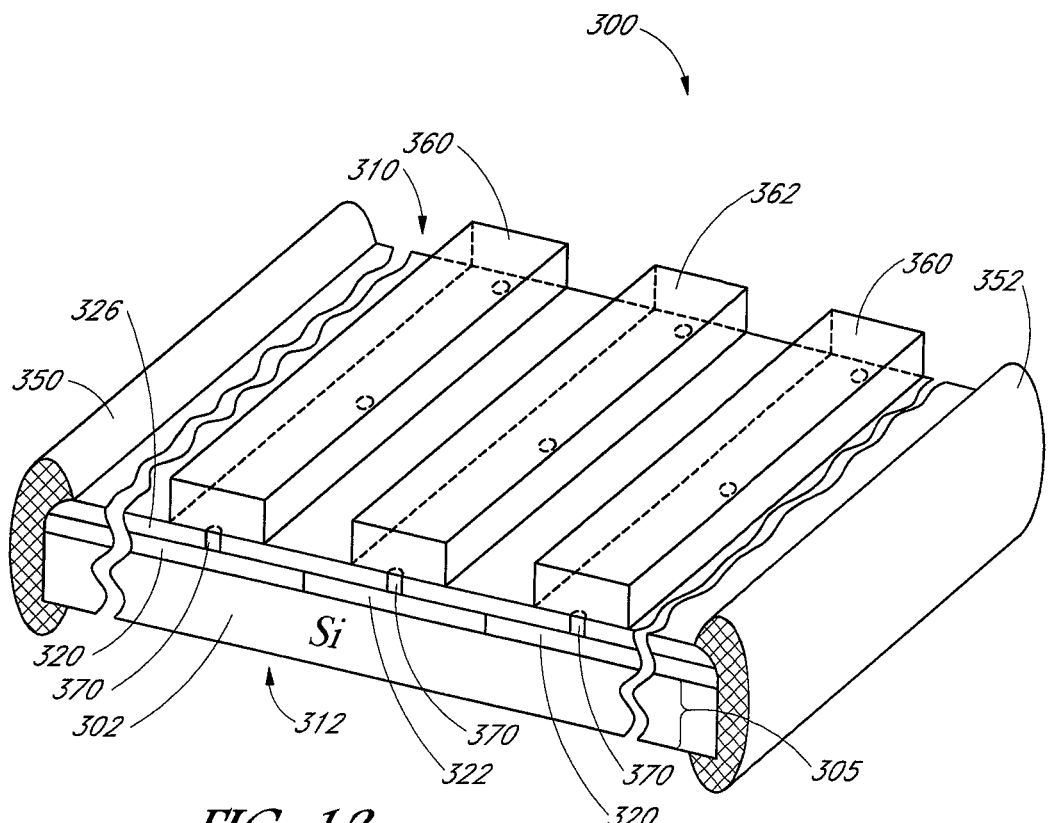
FIG. 13 is a perspective view of the solar cell of FIG. 12 in accordance with an embodiment of a method for manufacturing a solar cell.

With reference to FIG. 13, there is shown a perspective view of the solar cell of FIG. 12. As discussed above, the solar cell 300 includes a silicon substrate 302. The silicon substrate 302 can have a thickness 305 which is thick or greater than 140 microns. The silicon substrate 302 can have a thickness 305 which is thin or in the range of 50-140 microns. The silicon substrate 302 includes first and second doped regions 320, 322. A first dielectric layer 326 is formed over the first and second doped regions 320, 322. In an embodiment, the first and second interdigitated contact fingers 360, 362 are coupled to the first and second doped regions 320, 322 through the contact holes 370. In an embodiment, the contact holes 370 are formed through an ablation process including, but not limited to, laser ablation. FIG. 13 shows the first protective film 350, 352 formed along the side edges of the solar cell 300.

Figure 14:
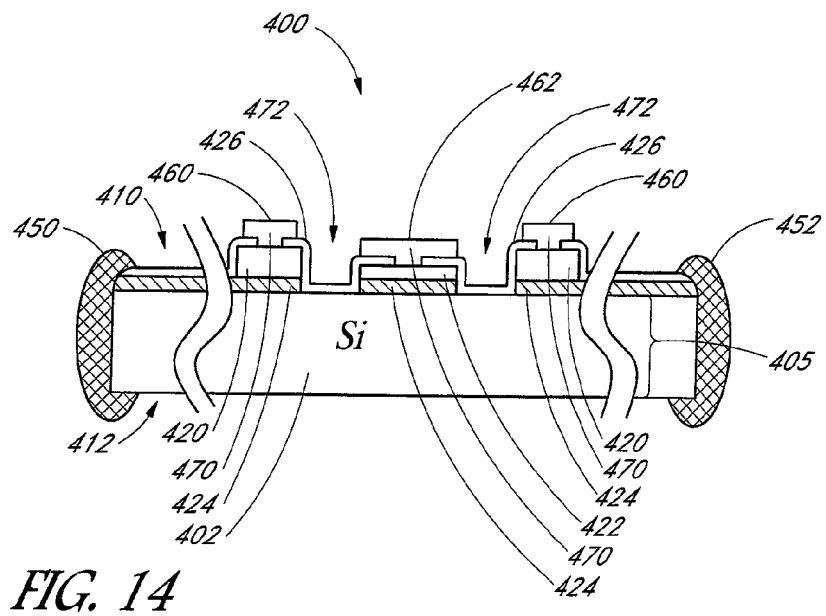
FIG. 14 is another cross-sectional representation of a solar cell being fabricated in accordance with an embodiment of a method for manufacturing a solar cell.

FIG. 14 illustrates yet another method of fabricating a solar cell. The method includes providing a solar cell 400 having a front side 412 which faces the sun during normal operation, a back side 410 opposite the front side 412, and four side edges. The method includes forming first and second doped regions 420, 422 on the back side of the solar cell 400, where the solar cell 400 includes a silicon substrate 402. In an embodiment the silicon substrate 402 is polysilicon or multi-crystalline. In another embodiment, the silicon substrate 402 has thickness 405 in the range of 50-140 microns. In still another embodiment, the silicon substrate 402 has a thickness 405 greater than 140 microns. In yet another embodiment, the first and second doped regions 420, 422 are formed through a thermal process. In an embodiment, an oxide layer is deposited over the first and second doped regions 420, 422, serving as a protective barrier for both regions. In another embodiment, the first and second doped regions 420, 422 each includes a doping material but is not limited to a positive-type dopant such as boron or a negative-type dopant such as phosphorous. The method includes forming a first dielectric layer 426 on the first and second doped regions 420, 422. In an embodiment, the first dielectric layer 426 is composed of silicon nitride (SiN). The method includes forming a second dielectric layer 424 over the silicon substrate 402 prior to forming the first and second doped regions 420, 422. In an embodiment, the second dielectric layer 424 is composed of a tunnel oxide. In another embodiment, both the first and second doped regions 420, 422 include diffusion regions in an interdigitated pattern. In an embodiment, the first and second doped regions are instead first and second doped polysilicon regions. The method includes, forming a trench region 472 to separate both the first and second doped regions 420, 422 thereby reducing recombination at the interface. In an embodiment, the trench region 472 includes a textured surface for additional collection of light from the back side 410 of the solar cell 400. The method includes forming a first and second plurality of contact holes 470 through the first dielectric layer 426 and on the first and second doped regions 420, 422. The method includes forming a first protective film 450, 452 along at least one side edge of the solar cell. In an embodiment, the first protective film 450, 452 has an elastic modulus of at least 3 GPa. In another embodiment, the application of the first protective film 450, 452 prevents cracking near at least one side edge of the solar cell 400 and improves structural integrity against mechanical stress. The method includes forming contact holes 470 through a chemical etch, ablation or any industry standard lithography process. The method includes performing an electroplating process to form a first and second plurality of interdigitated metal contact fingers 460, 462, where the first and second plurality of interdigitated metal contact fingers 460, 462 are electrically coupled to the contact holes 470 through the first dielectric layer 426 on the first and second doped regions 420, 422 respectively. In an embodiment, a texturized region can be formed on the front side 412 of the solar cell 400 for increased solar radiation collection. A texturized region 420 is one which has a regular or an irregular shaped surface for scattering incoming light, decreasing the amount of light reflected back of the surface of the solar cell 400. In still another embodiment, a third dielectric layer can be formed on the texturized region on the front side 412 of the solar cell 400. In still another embodiment, the third dielectric layer is composed of silicon nitride (SiN). In yet another embodiment, the first 426 and third dielectric layers are anti-reflective layers.

Figure 15:
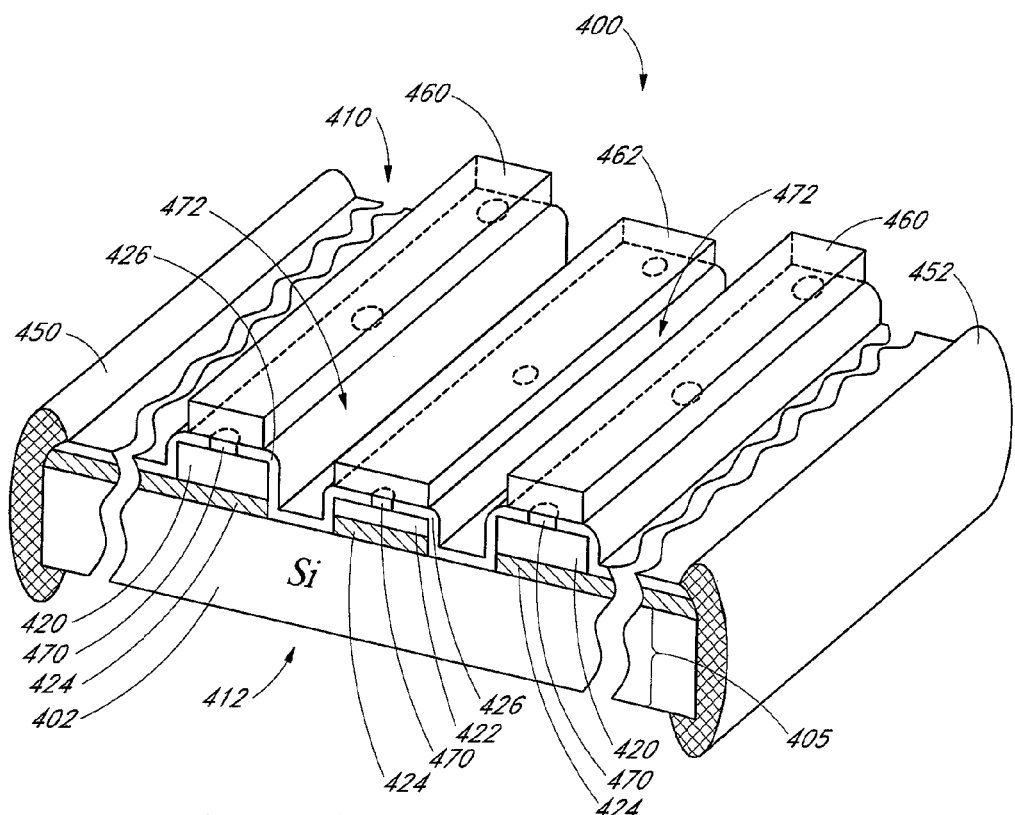
FIG. 15 is a perspective view of the solar cell of FIG. 14 in accordance with an embodiment of a method for manufacturing a solar cell.

With reference to FIG. 15, there is shown a perspective view of the solar cell of FIG. 14. As discussed above, the solar cell 400 includes a silicon substrate 402. In an embodiment, the silicon substrate 402 has a thickness 405 which is thick or greater than 140 microns. In another embodiment, the silicon substrate 402 has a thickness 405 which is thin or in the range of 50-140 microns. The silicon substrate 402 includes first and second doped regions 420, 422. A first dielectric layer 426 is formed over the first and second doped regions 420, 422. A trench region 472 is shown where the trench region 472 separates both the first and second doped regions 420, 422 thereby reducing recombination at the interface. In an embodiment, the trench region 472 includes a textured surface for additional collection of light from the back side 410 of the solar cell 400. In an embodiment, the first and second interdigitated contact fingers 460, 462 are coupled to the first and second doped regions 420, 422 through the contact holes 470. In an embodiment, the contact holes 470 are formed through an ablation process including, but not limited to, laser ablation. FIG. 15 shows the first protective film 450, 452 formed along the side edges of the solar cell 400.

Figure 16:
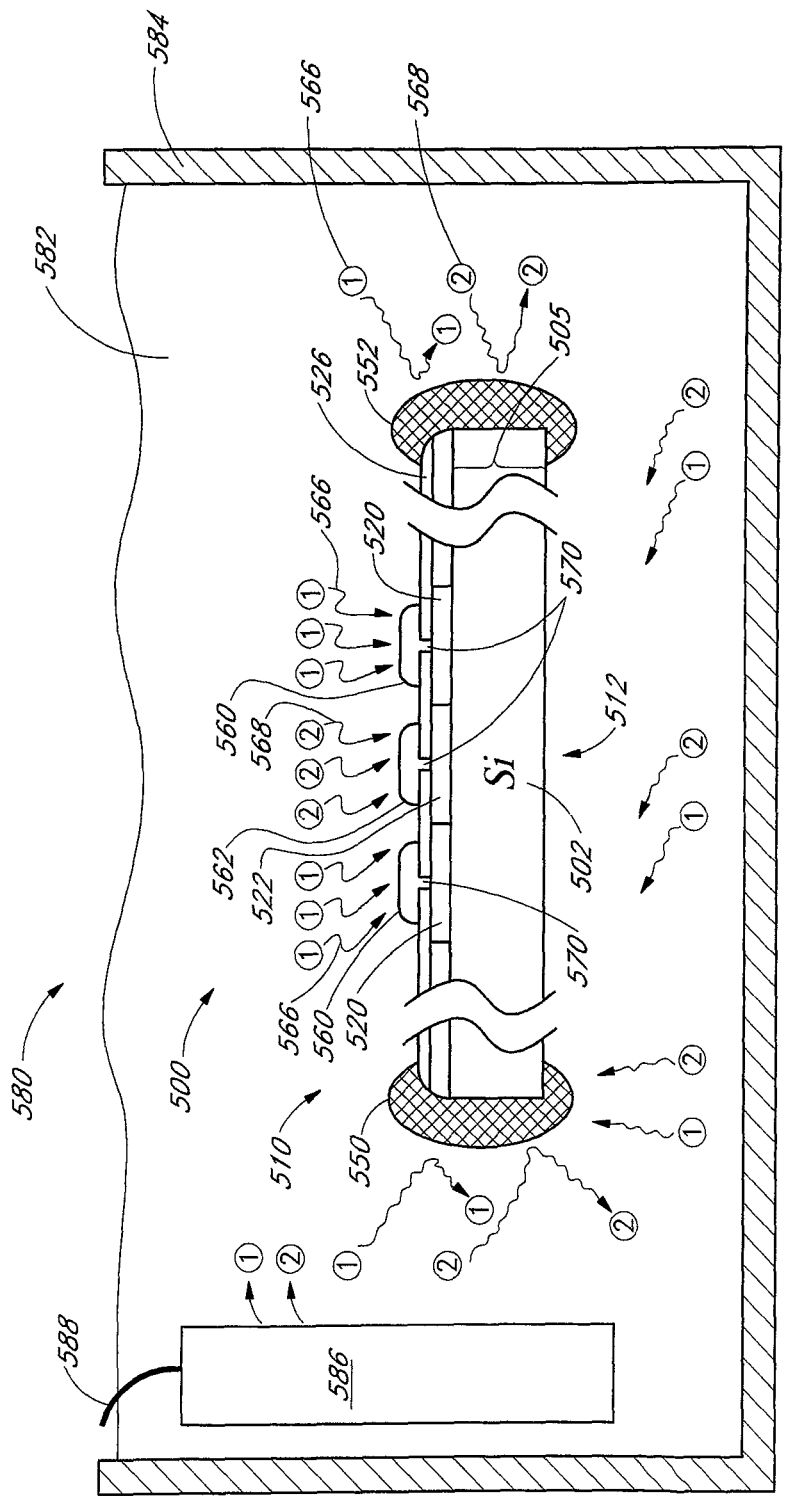
FIG. 16 is cross-sectional representation of a solar cell being manufactured in accordance with yet another embodiment of a method for manufacturing a solar cell.

FIG. 16 illustrates a method plating metal to a solar cell. The method includes providing a solar cell 500 having a front side 512 which faces the sun during normal operation, a back side 510 opposite the front side 512, and four side edges. The solar cell includes first and second doped regions 520, 522 on the back side of the solar cell 500, where the solar cell 500 includes a silicon substrate 502. In an embodiment the silicon substrate 502 is polysilicon or multi-crystalline. In another embodiment, the first and second doped regions 520, 522 are formed through a thermal process. In still another embodiment, an oxide layer is deposited over the first and second doped regions 520, 522, serving as a protective barrier for both regions. In yet another embodiment, the first and second doped regions 520, 522 each includes a doping material but is not limited to a positive-type dopant such as boron or a negative-type dopant such as phosphorous. In an embodiment, the first and second doped regions 520,522 are instead first and second doped polysilicon regions. In another embodiment, the solar cell 500 includes a texturized region on the front side 512 of the solar cell 500. In still another embodiment, a first dielectric layer 526 is deposited over the first and second doped regions 520, 522. In yet another embodiment, a second dielectric layer is deposited over the texturized region. The method includes forming a first protective film 550, 552 along at least one side edge of the solar cell 500. The method includes forming contact holes 570 through a chemical etch, ablation or any industry standard lithography process. The method includes forming a first and second plurality of interdigitated metal contact fingers 560, 562 through an electroplating process similar to that described in FIG. 6. In an embodiment, the method includes providing an electroplating setup 580, where the electroplating setup 580 includes an electroplating bath 582 and a plating bath enclosure 584. In the continued embodiment, the method also includes suspending the solar cell 500 by a holder and a plurality of fixtures. In another embodiment, the method further includes providing an anode 586 connected to an external power supply by a wire or an interconnect 588. In the continued embodiment the method also includes inducing a current, provided by the anode 586 coupled with the external power supply, within the electroplating bath 582, which may allow for the flow of electrons within the bath and further allow for electroplating of a metal such as, but not limited to, copper, tin, aluminum, silver, gold, chromium, iron, nickel, zinc, ruthenium, palladium, or platinum. In still another embodiment, the method includes performing an electroplating process to form the first and second interdigitated contact fingers 560, 562 though the contact holes 570 on the first and second doped regions 520, 522 by plating a first and second metal ions 566, 568 from the anode 586 dispersed within the electroplating bath 582 to the first and second doped regions 520, 522.

Figure 17:
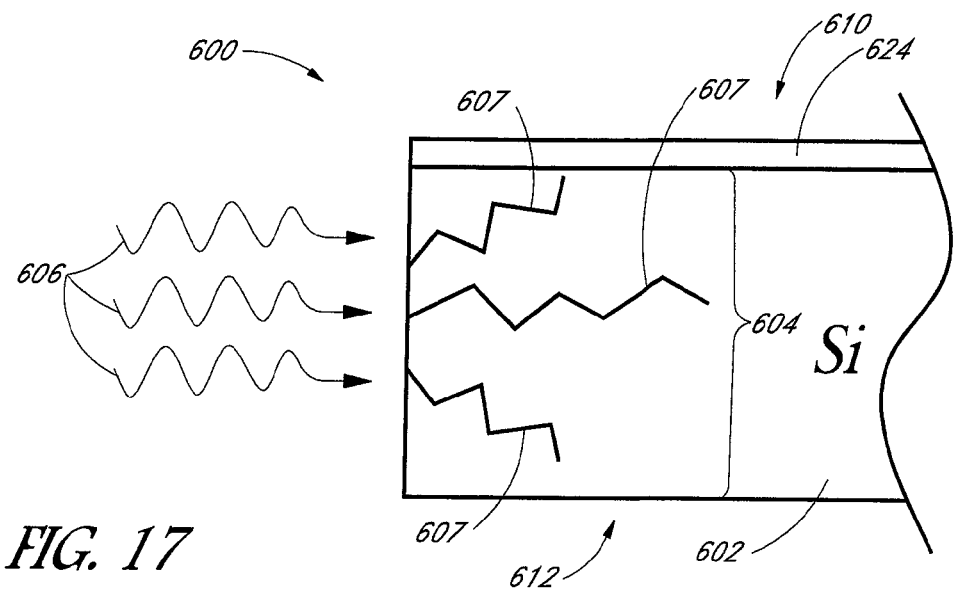
FIGS. 17-20 are cross-sectional representations of a solar cell edge in accordance with an embodiment of a method for manufacturing a solar cell.

With reference to FIG. 17, there is shown a cross-sectional view of an edge of a solar cell subjected to a sample force. The a solar cell 600, similar to the above, having a front side 612 which faces the sun during normal operation, a back side 610 opposite the front side 612, and at least one side edge. The solar cell 600 of FIG. 17 also includes a silicon substrate 602 and a doped region 624, where the silicon substrate 602 has a thickness 604 greater than 140 microns. FIG. 17 shows a sample force 606 acting on the edge of the silicon substrate 602 with a thickness 604, where the force 606 is only sufficient to crack 607 the side edge of the silicon substrate 602.

Figure 18:
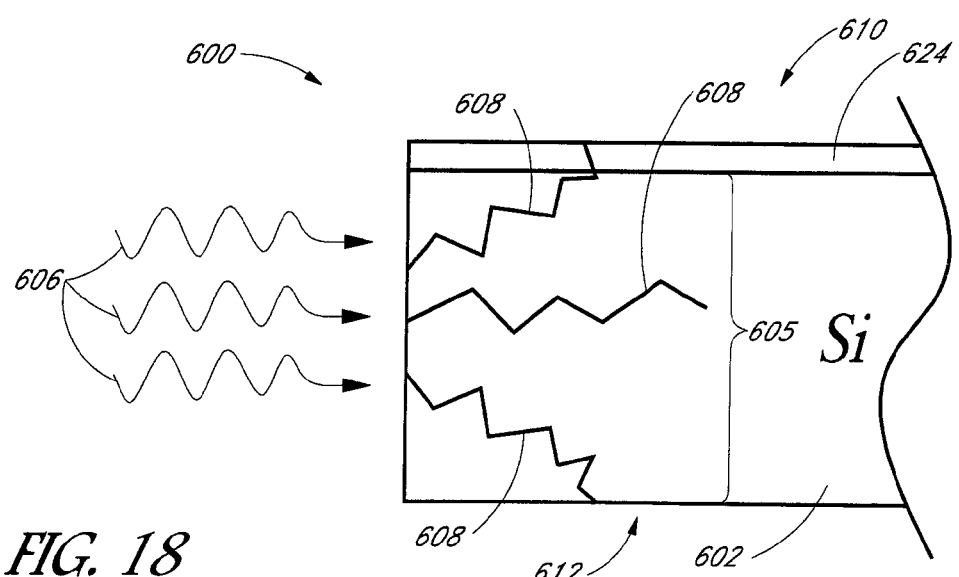
Figure 19:
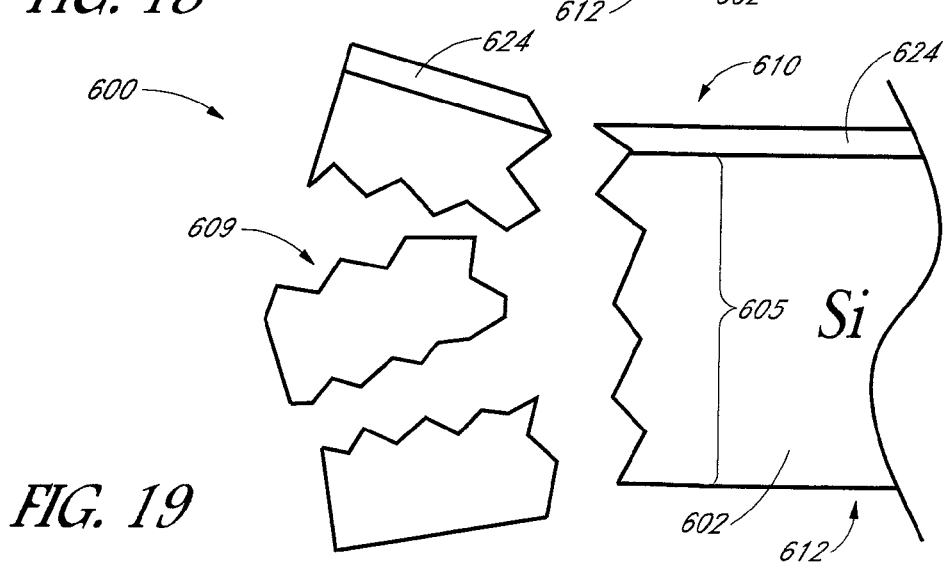

FIGS. 18 and 19 illustrate a cross-sectional view of an edge of another solar cell experiencing the same sample force of FIG. 17. Similar to FIG. 17, the solar cell 600 of FIG. 18 has a silicon substrate 602, where the thickness 605 of the silicon substrate is within the range of 50-140 microns. FIG. 18 shows the solar cell 600 subjected to the same sample force 606 of FIG.17. As a result of the thickness 605 of the wafer and the magnitude of the force, cracks 608 have the opportunity to propagate from the side edge to the front side 612 and the back side 610 of the solar cell 600. FIG. 19 illustrates the result can also lead to breakage 609 of the silicon substrate 602, including the doped region 624. In another example, the sample force 606 can be due to mechanical stress from handling solar cells during solar cell fabrication, shipping or solar module manufacturing.

Loss of saleable product due to mechanical stress induced defects is measured in terms of mechanical yield. Mechanical yield is very much an important part of the solar cell manufacturing process. Higher mechanical yield loss means less produced solar cell product. The inventors thus propose to protect the solar cell edges using a protective film 650 from mechanical forces 608, where a direct result would be to increases the yield of saleable product for a given solar manufacturing process.

Figure 20:
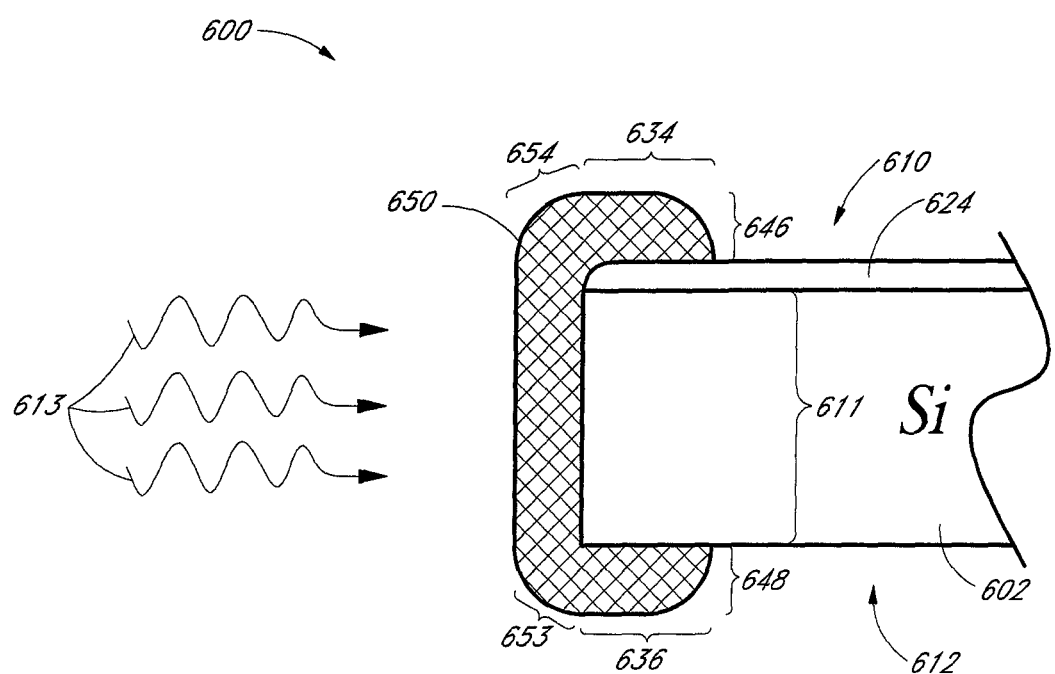

With reference to FIG. 20, there is shown a solar cell of an embodiment of the present inventions. As discussed in FIGS. 17-19, the solar cell 600, similar to the above, has a front side 612 which faces the sun during normal operation, a back side 610 opposite the front side 612, and at least one side edge. The solar cell 600 also includes a silicon substrate 602 and a doped region 624, where the silicon substrate 602 has a thickness 611. The solar cell also includes a protective film 650 deposited along at least one side edge. Forming the protective film 650 through the application of an insulating material, including curing as earlier discussed, can vary depending on the application process. In an embodiment, a generally desirable application thickness 634, 636 along the front side 612 and back side 610 of the solar cell is at most 1 millimeter. In another embodiment, the thickness 654, 653 of the protective film 650 extending outward from the solar cell edge is dependent on the cohesive property of the protective film 650, while the protective film height 646, 648 on the front side 612 and back side 610 of the solar cell is in the range of, but not limited to, 50-100 microns. In some embodiments, the regions of thickness 636, height 648 and thickness 653 at the front side 612 of the solar cell 600 are removed such that only the protective film 650 along the side edge with a thickness 634, height 646 and the thickness 654 at the back side of the solar cell remain. In another embodiment, the regions of thickness 634, height 646 and thickness 654 at the back side 610 of the solar cell 600 are removed such that only the protective film 650 along the side edge with a thickness 636, height 648 and the thickness 653 at the front side 612 of the solar cell are present. FIG. 20 shows a sample force 613 acting on the edge of the silicon substrate 602, where the protective film 650 prevents cracks, chips and breakages along at least one side edge of silicon substrate 602 of the solar cell 600.

Figure 21:
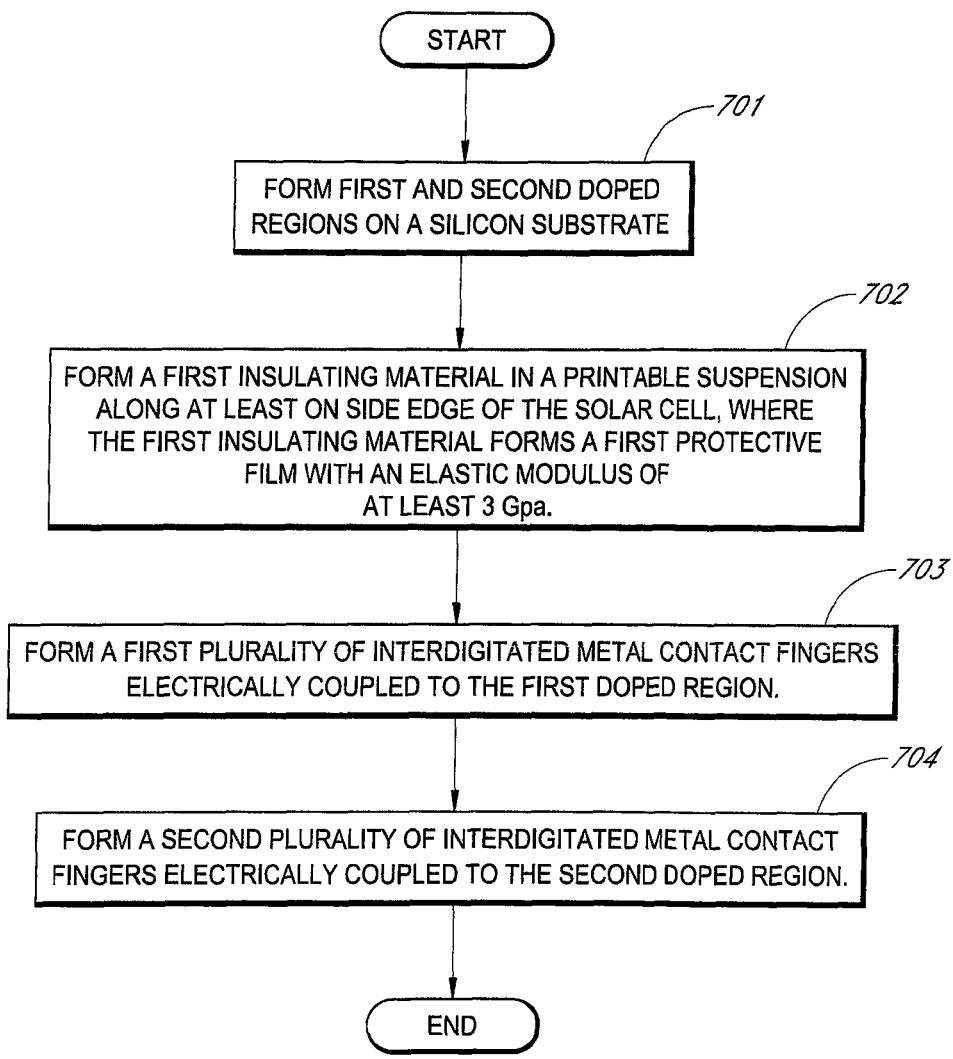
FIGS. 21-23 show flow diagrams of methods for manufacturing solar cells.
Figure 22:
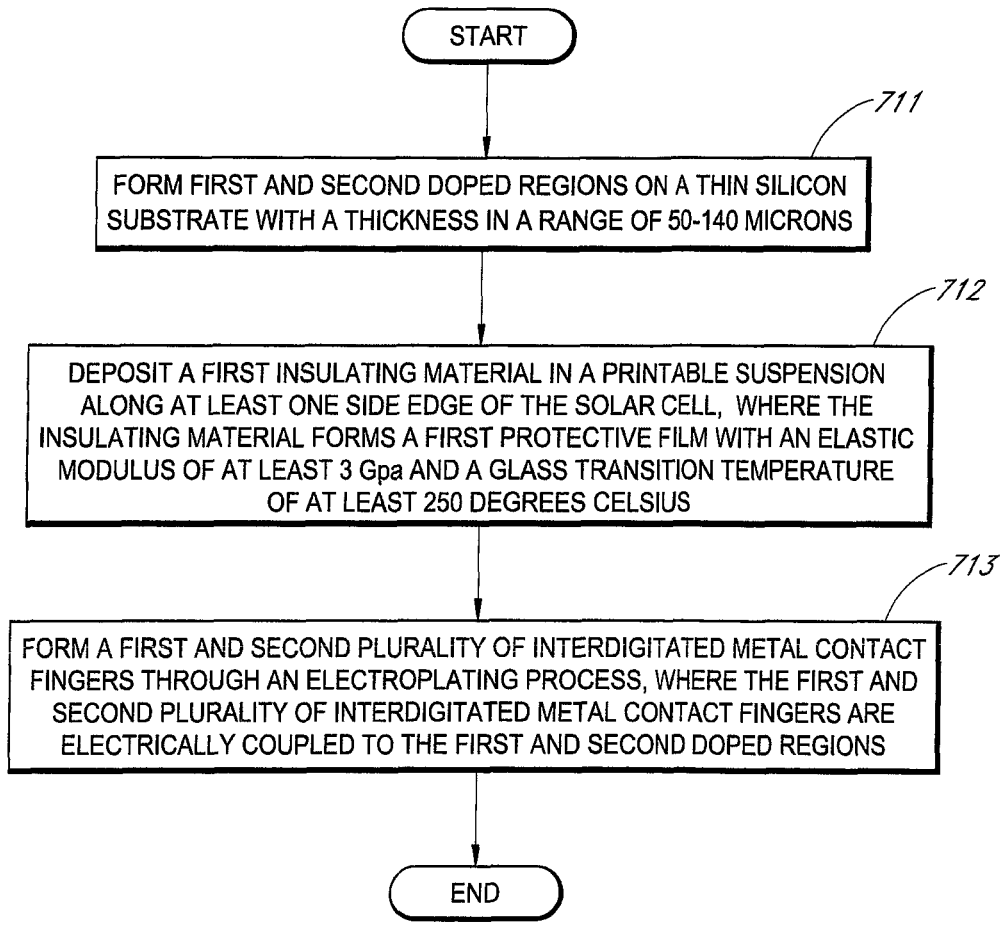
Figure 23:
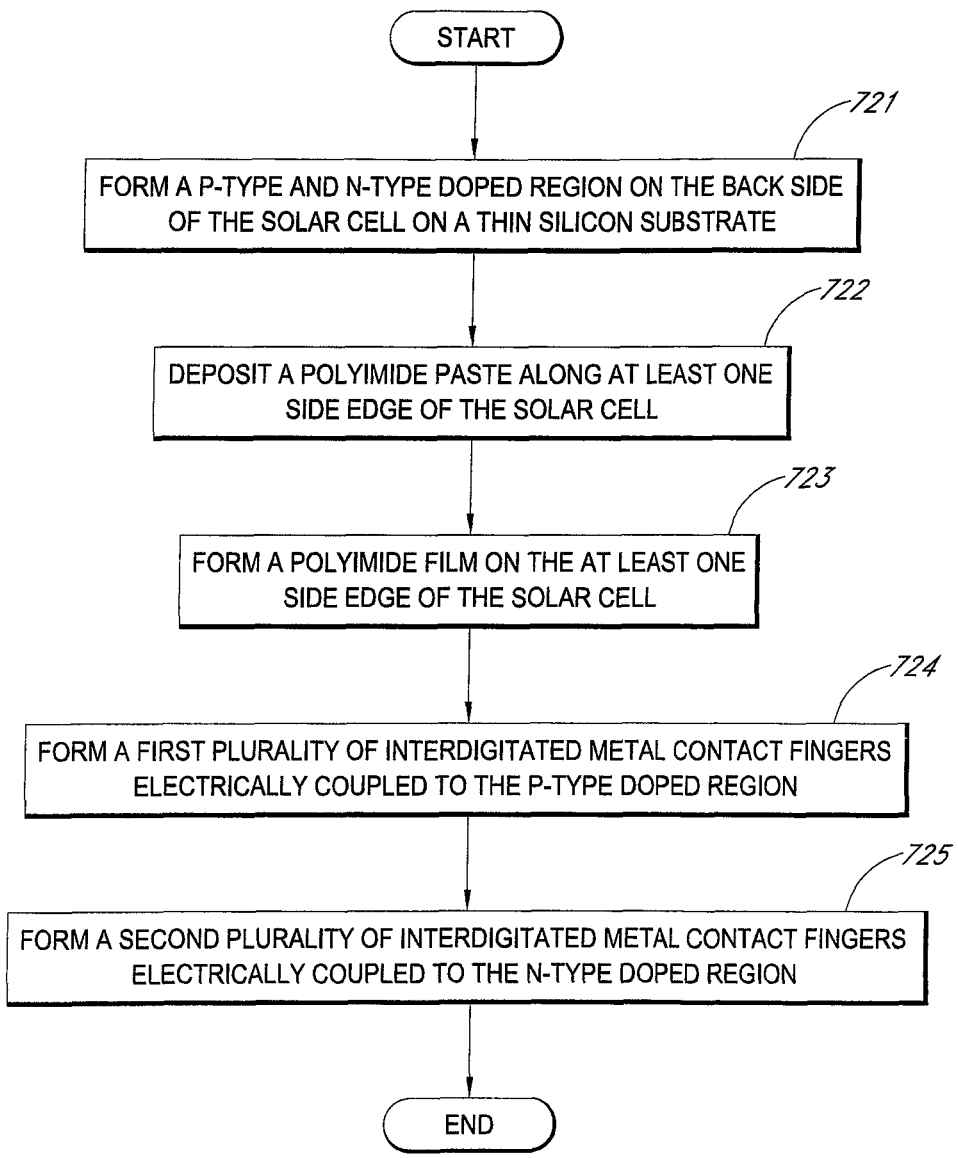

FIGS. 21-23 show flow diagrams of methods for manufacturing solar cells in accordance with embodiments of the present invention. The steps of the methods of FIGS. 21-23 may be performed in the order they are shown, or in some other order without detracting from the merits of the present invention.

The method of FIG. 21 may include forming first and second doped regions on a silicon substrate of the solar cell (step 701). First insulating material in a printable suspension is formed at least on one side edge of the solar cell, the first insulating material forming a first protective film with an elastic modulus of at least 3 GPa. (step 702). A first plurality of interdigitated metal contact fingers that are electrically coupled to the first doped region is formed (step 703). A second plurality of interdigitated metal contact fingers that is electrically coupled to the second doped region is formed (step 704).

The method of FIG. 22 may include forming first and second doped regions on a thin silicon substrate with a thickness in a range of 50-140 microns (step 711). A first insulating material in a printable suspension is deposited along at least one side edge of the solar cell, wherein the insulating material forms a first protective film with an elastic modulus of at least 3 GPa and a glass transition temperature of at least 250 degrees Celsius (step 712). A first and second plurality of interdigitated metal contact fingers are formed through an electroplating process, where the first and second plurality of interdigitated metal contact fingers are electrically coupled to the first and second doped regions (step 713).

The method of FIG. 23 may include forming a P-type and N-type doped region on the back side of a solar cell on a thin silicon substrate (step 721). A polyimide paste is deposited along at least one side edge of the solar cell (step 722). A polyimide film is formed on the at least one side edge of the solar cell (step 723). A first plurality of interdigitated metal contact fingers that are electrically coupled to the P-type doped region is formed (step 724). A second plurality of interdigitated metal contact fingers that is electrically coupled to the N-type doped region or regions is formed (step 725).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for manufacturing a solar cell, the solar cell having a front side which faces the sun during normal operation, a back side opposite the front side, and four side edges, the method comprising:

forming first and second doped regions on the back side of the solar cell;

before forming metal contact fingers that are electrically coupled to the first and second doped regions, forming a first insulating material in a printable suspension at least on one side edge of the solar cell, wherein the first insulating material forms a continuous first protective film with an elastic modulus of at least 3 GPa and the first protective film envelops a portion of the front side, the at least one side edge, and a portion of the back side of the solar cell comprising the first and second doped regions;

forming a first plurality of interdigitated metal contact fingers electrically coupled to the first doped region; and forming a second plurality of interdigitated metal contact fingers electrically coupled to the second doped region.

2. The method of claim 1, wherein forming the first doped region comprises forming a continuous diffusion region, forming the second doped region comprises forming dotted diffusion regions each surrounded by the continuous diffusion region, and the method further comprises forming a second insulating material in a printable suspension between the first doped region and the second plurality of interdigitated metal contact fingers, wherein the second insulating material forms a second protective film with an elastic modulus of at least 3 GPa.

3. The method of claim 2, wherein the first and second insulating materials are of the same material.

4. The method of claim 1, wherein forming the first and second doped regions comprises forming first and second diffusion regions in an interdigitated pattern and, the method further comprises ablating a first plurality of contact holes through a first dielectric layer to allow the first diffusion region to be electrically coupled to the first plurality of interdigitated metal contact fingers and ablating a second plurality of contact holes through the first dielectric layer to allow the second diffusion region to be electrically coupled to the second plurality of interdigitated metal contact fingers.

5. The method of claim 1, wherein forming the first and second doped regions comprises forming the first and second doped regions in an interdigitated pattern and, the method further comprises forming a first dielectric layer between a silicon substrate of the solar cell and the first and second doped regions, etching a trench region between the first and second doped regions, and forming a second dielectric layer within the trench region.

6. The method of claim 1, wherein the first protective film has an elastic modulus of 3 GPa.

7. The method of claim 1, wherein the first protective film has a glass transition temperature of at least 250 degrees Celsius.

8. The method of claim 1, wherein the first protective film has an elongation break point of 13 percent.

9. The method of claim 1, wherein forming the first and second plurality of interdigitated metal contact fingers comprises performing an electroplating process, wherein the first protective film is adapted to protect at least one edge of the solar cell from being plated with metal during the electroplating process.

10. The method of claim 1, wherein forming the first protective film comprises thermally curing the first insulating material to form the first protective film along the at least one side edge of the solar cell.

11. The method of claim 1, wherein forming the first insulating material comprises depositing a polymer material.

12. The method of claim 1, wherein forming the first insulating material comprises depositing polyvinyl chloride (PVC).

13. The method of claim 1, wherein forming the first insulating material comprises depositing polyimide.

14. The method of claim 1, wherein forming the first and second doped regions comprises doping a silicon substrate of the solar cell with a dopant selected from the group consisting of boron and phosphorus.

15. The method of claim 1, wherein forming the first insulating material comprises screen printing the first insulating material in the printable suspension unto at least one side edge.

16. The method of claim 1, wherein forming the first insulating material comprises depositing the first insulating material using an edge coating process.

17. A method for manufacturing a solar cell, the solar cell having a front side which faces the sun during normal operation, a back side opposite the front side, and four side edges, the method comprising:

forming first and second doped regions on a thin silicon substrate with a thickness in a range of 50-140 microns;

before forming metal contact fingers that are electrically coupled to the first and second doped regions, depositing a first insulating material in a printable suspension along at least one side edge of the solar cell, wherein the insulating material forms a continuous first protective film with an elastic modulus of at least 3 GPa and a glass transition temperature of at least 250 degrees Celsius and the first protective film envelops a portion of the front side, the at least one side edge, and a portion of the back side of the solar cell comprising the first and second doped regions; and forming first and second plurality of interdigitated metal contact fingers through an electroplating process, wherein the first and second plurality of interdigitated metal contact fingers are electrically coupled to the first and second doped regions.

18. The method of claim 17, wherein depositing the first insulating material comprises depositing the first insulating material on at least one side edge toward an inner portion of the front and back side of the solar cell at a thickness of at most 1 millimeter.

19. The method of claim 17, wherein the first protective film is formed using a thermal curing process, the thermal curing process comprising:

ramping up the temperature from a first curing temperature to a second curing temperature over a first curing duration;

maintaining the curing temperature for a second curing duration; and ramping down the temperature from the second curing temperature back to the first curing temperature over a third curing duration.

20. A method for manufacturing a solar cell, the solar cell having a front side which faces the sun during normal operation, a back side opposite the front side, and four side edges, and the method comprising:

forming a P-type doped region and an N-type doped region on the back side of the solar cell on a thin silicon substrate;

before forming metal contact fingers that are electrically coupled to the P-type and N-type doped regions, depositing a polyimide paste along at least one side edge of the solar cell;

forming a continuous polyimide film on the at least one side edge, a portion of the front side, and a portion of the back side of the solar cell comprising the first and second doped regions;

forming a first plurality of interdigitated metal contact fingers electrically coupled to the P-type doped region; and forming a second plurality of interdigitated metal contact fingers electrically coupled to the N-type doped region.

* * * * *